US012039964B2

(12) United States Patent
He et al.

(10) Patent No.: US 12,039,964 B2
(45) Date of Patent: Jul. 16, 2024

(54) AUDIO PROCESSING SYSTEM SIGNAL-LEVEL BASED TEMPORAL MASKING

(71) Applicant: CIRRUS LOGIC INTERNATIONAL SEMICONDUCTOR LTD., Edinburgh (GB)

(72) Inventors: Ku He, Austin, TX (US); Venugopal Choukinishi, Austin, TX (US); Kemal S. Demirci, Dallas, TX (US); David M. Olivenbaum, Austin, TX (US); Amar Vellanki, Cedar Park, TX (US); Xin Zhao, Austin, TX (US); Wai-Shun Shum, Austin, TX (US); Xiaofan Fei, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 323 days.

(21) Appl. No.: 17/540,376

(22) Filed: Dec. 2, 2021

(65) Prior Publication Data
US 2022/0284877 A1 Sep. 8, 2022

Related U.S. Application Data

(60) Provisional application No. 63/156,088, filed on Mar. 3, 2021.

(51) Int. Cl.
*G10K 11/175* (2006.01)
*H03F 1/32* (2006.01)
(Continued)

(52) U.S. Cl.
CPC ....... *G10K 11/1752* (2020.05); *H03F 1/3264* (2013.01); *H03F 3/185* (2013.01);
(Continued)

(58) Field of Classification Search
CPC ......... G10K 11/1752; G10K 11/17823; G10K 11/17885; G10K 2210/3014
(Continued)

(56) References Cited

U.S. PATENT DOCUMENTS 7,627,481 B1 * 12/2009 Kuo ...................... G10L 19/025
704/500
10,043,527 B1 * 8/2018 Gurijala ................ G10L 19/018
(Continued)

*Primary Examiner* — Alexander Krzystan
(74) *Attorney, Agent, or Firm* — Mitch Harris, Atty at Law, LLC; Andrew M. Harris

(57) ABSTRACT

An audio processing system reduces perception of audible artifacts due to changes in an element in an audio channel of the audio processing system. The system reproduces an audio input signal and produces an audio output signal with the audio channel. The channel has an adjustable or selectable element that, responsive to a control signal, changes a characteristic of the audio processing channel, which generates a transient in the audio output signal. The systems include a level detector for measuring a signal level of the audio input signal and a controller responsive to an output of the level detector to determine a masking time interval available from the audio output signal due to signal content in the audio input signal. The controller generates the control signal to change the characteristic of the audio processing channel so that at least a portion of the transient occurs in the masking time interval.

20 Claims, 10 Drawing Sheets

(51) Int. Cl.
*H03F 3/185* (2006.01)
*H03G 3/30* (2006.01)
*G10K 11/178* (2006.01)
*H04R 3/00* (2006.01)

(52) U.S. Cl.
CPC ......... *H03G 3/3005* (2013.01); *G10K 11/178* (2013.01); *H03F 2200/03* (2013.01); *H04R 3/005* (2013.01)

(58) Field of Classification Search
USPC .......................................... 700/94; 381/73.1
See application file for complete search history.

(56) References Cited

U.S. PATENT DOCUMENTS

| | | |
|---|---|---|
| 10,044,323 B1 | 8/2018 | He et al. |
| 2009/0144054 A1* | 6/2009 | Sudhakar .............. G10L 19/022 704/211 |
| 2015/0092967 A1* | 4/2015 | Fitz ..................... H04R 25/356 381/317 |
| 2020/0059214 A1* | 2/2020 | Perrott ................. H04R 29/004 |
| 2021/0012763 A1 | 1/2021 | Wurtz |
| 2022/0284877 A1* | 9/2022 | He ..................... G10K 11/1752 |
| 2023/0103164 A1* | 3/2023 | Leuenberger ........ H04R 1/1041 381/74 |

* cited by examiner

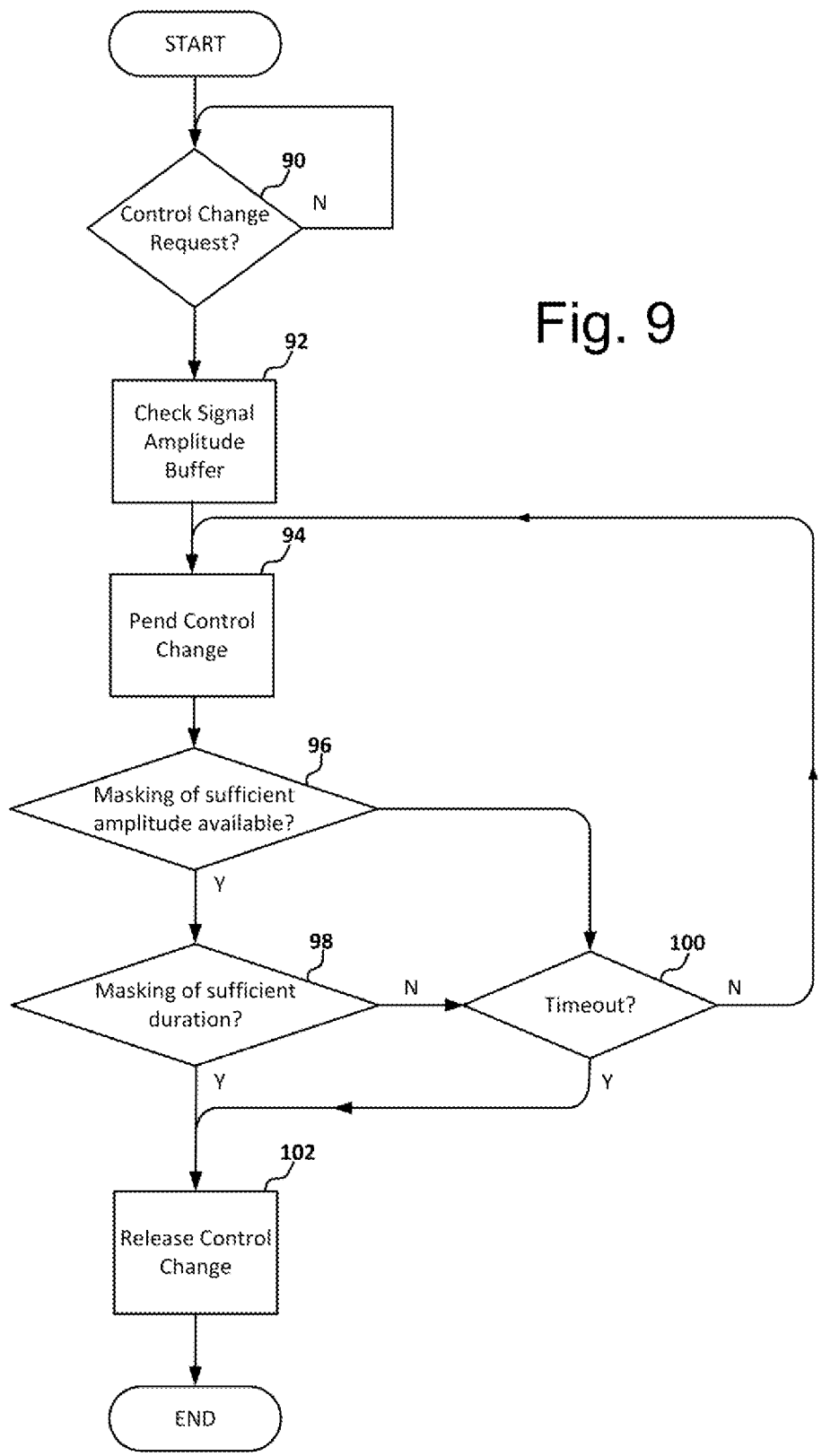

AUDIO PROCESSING SYSTEM SIGNAL-LEVEL BASED TEMPORAL MASKING

The present Application Claims priority under 35 U.S.C. § 119(e) to U.S. Provisional Patent Application 63/156,088 filed on Mar. 3, 2021, the disclosure of which is incorporated herein by reference.

BACKGROUND

1. Field of Disclosure

The field of representative embodiments of this disclosure relates to audio signal processing methods and circuits that suppress audibility of artifacts due to changes in an audio processing channel by taking advantage of temporal masking properties of an audio signal being reproduced by the audio processing channel.

2. Background

Audio processing systems designed to operate from battery power frequently include selectable operating modes, including selectable audio paths. For example, an audio amplification system for a mobile device may include a low-noise operating mode corresponding to a first audio path that is used for reproduction of low-amplitude signals, while a power-efficient second audio path reproduces high-amplitude signals. Audio systems in general may have selectable sample rates, selectable gains and other selectable characteristics. Changes in the operating mode, gain changes, sample rate changes, and other configuration changes may cause audible artifacts, e.g., "pops" or "clicks" when configuration changes are selected.

When changes are made to an audio reproduction channel while the channel is not actually being used, the output of the channel may be muted. However, the above-mentioned configuration changes are frequently required during reproduction of an audio signal, and the changes may cause shifts in DC offset or gain that cannot be masked by muting. In particular, in systems including adaptive noise-cancelling (ANC), the program audio may be absent, but the audio channel is reproducing an anti-noise signal, that while ideally inaudible due to the signal canceling ambient noise, will cause artifacts when the gain or DC offset of the audio channel changes.

Therefore, it would be advantageous to provide an audio processing system that suppresses artifacts due to changes in an audio processing channel, including audio processing channels that are used in ANC applications.

SUMMARY

Reduced audible artifacts due to changes in an audio channel element may be accomplished in systems and their methods of operation.

The systems are audio processing systems that reproduce an audio input signal and produce an audio output signal with an audio processing channel. The audio processing channel has an adjustable or selectable element that, responsive to a control signal, changes a characteristic of the audio processing channel, which generates a transient in the audio output signal. The systems include a signal level detector for measuring a signal level of the audio input signal and a controller that, responsive to an output of the signal level detector, determines a masking time interval available from the audio output signal due to signal content in the audio input signal. The controller generates the control signal to change the characteristic of the audio processing channel so that at least a portion of the transient occurs in the masking time interval.

The summary above is provided for brief explanation and does not restrict the scope of the Claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

BRIEF DESCRIPTION OF THE DRAWINGS

FIG. 9 is a flowchart illustrating an example masking window evaluation process that may be implemented by masking window determination block 20B of FIG. 8.

DETAILED DESCRIPTION OF ILLUSTRATIVE EMBODIMENT

The present disclosure encompasses audio processing systems having an audio channel that has a changeable element and that generates audible transients when the element is changed. Audibility of the change is suppressed by synchronizing the change within a temporal masking interval that is determined in accordance with the output of a signal level detector. The changeable element may be a signal path, gain, coefficient selection, or an on-line calibration interval within the audio processing system, and a controller may synchronize selection of the signal path to occur within a detected available temporal masking interval. Masking of audio artifacts by a signal having greater energy in regions of the frequency spectrum in which the artifacts have energy, i.e., direct masking, occurs spontaneously and is not something that may generally be arranged for artifacts due to the above-listed system changes, unless the acoustic output of the reproduced audio program is known to be at a sufficiently high level to make the change. Temporal masking is a technique that takes advantage of portions of a program having greater energy in the needed regions of the frequency spectrum, but is "temporal" in the sense that masking is possible both before and after a high energy portion of the program. The systems described below provide temporal masking by observing program audio signal levels and determining the appropriate time to allow artifact-generating system changes to occur. While the audio processing systems in the examples described below may provide an output to an electroacoustic output transducer, the techniques disclosed herein are applicable to audio input systems, as well, for example audio preamplifier systems designed to receive microphone inputs may also benefit from synchronizing changes in their audio path, e.g., input gain adjustments during time intervals adjacent to high amplitude portions of the input signal.

Figure 1:
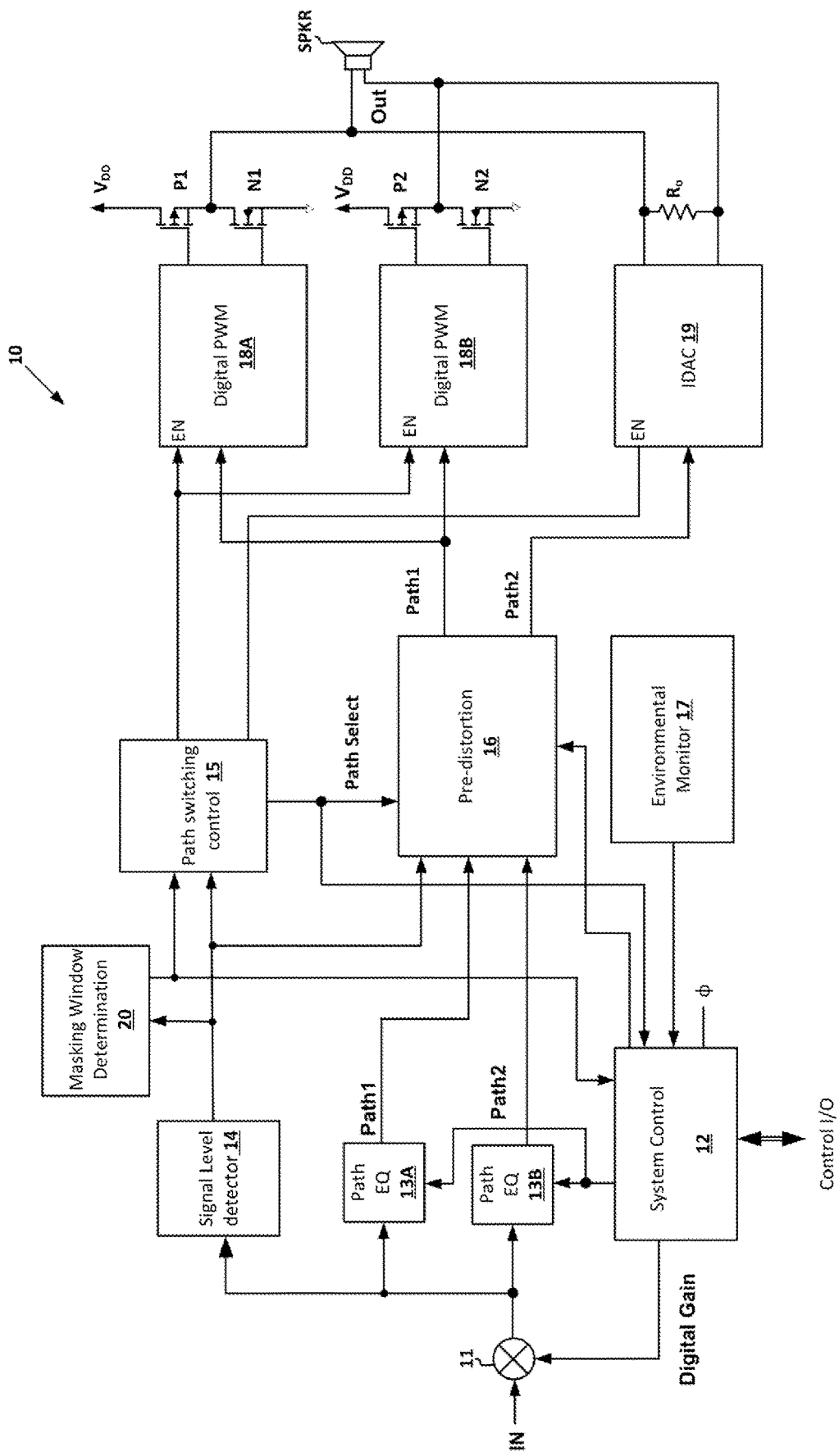
FIG. 1 is a block diagram of an example system 10 in which techniques according to an embodiment of the disclosure are practiced.

Referring now to FIG. 1, a block diagram of an example system 10 is shown, in accordance with an embodiment of the disclosure. Example system 10 is illustrated as an audio amplification system for providing an output signal Out to an audio transducer such as a speaker SPKR. Output signal Out is derived from a digital audio input signal In and to which a digital gain value Digital Gain is applied by a multiplier 11. Changes to digital gain value Digital Gain are one possible change that may generate audible artifacts that may be masked by program content in output signal Out having sufficient energy to provide direct or temporal masking. The output of multiplier 11 is provided to two different audio paths in example system 10. The first audio path is a high-efficiency voltage-based audio path Path1, in which equalization is applied by a path equalizer (EQ) 13A, predistortion is applied by a pre-distortion processing block 16, and which has an output generated by a pair of digital pulse-width modulation (PWM) blocks 18A, 18B that drive two complementary half-bridges formed by transistor pairs P1, N1 and P2, N2. The outputs of the half-bridges provide a differential output signal Out to speaker SPKR, when audio signal path Path1 is selected for operation by a path switching control block 15, which enables digital PWMs 18A, 18B. Path switching control block 15 selects audio signal path Path1 when a signal level detector 14 indicates that output signal Out has high amplitude. A system control 12 receives an indication from path switching control 15 when a signal level detector 14 indicates that the signal being reproduced has an amplitude greater than a threshold level, and system control allows the path change to occur at a time when a masking window determination block 20 determines that sufficient masking is available to make a system configuration change. Similarly, system control 12 supplies digital gain value Digital Gain to multiplier 11 and may postpone any requested change in digital gain value Digital Gain, e.g., from an external controller via a bus Control I/O, if sufficient masking is not available to make the change.

A second audio signal path Path2 in system 10 is selected by path switching control 15 when signal level detector 14 indicates that output signal Out has low amplitude. Equalization is applied by a path equalizer (EQ) 13B, predistortion is applied by pre-distortion processing block 16, and differential output signal Out is provided to speaker SPKR from a current-output digital-to-analog converter (IDAC) 19, when audio signal path Path2 is selected for operation by path switching control block 15, enabling IDAC 19 and disabling digital PWMs 18A, 18B. Path switching control 15 may also enable/disable path EQs 13A, 13B and portions of pre-distortion block 16, according to the selected audio path. Specific control signals have been omitted for clarity of illustration. Path switching control block 15 may postpone a change in path selection until masking window determination block indicates that masking is available. An output resistor Ro sets the output impedance presented to speaker SPKR when audio signal path Path2 is selected for operation. Additional system changes that system control 12 may make to the system configuration include changes to the pre-distortion polynomials applied to the signals in one or both of audio paths Path1, Path2, and changes to the equalization applied to the signals in audio paths Path1, Path2 by path EQs 13A, 13B. An environmental monitor 17 measures system characteristics such as power supply voltage and temperature, in order to inform adjustment of characteristics such as pre-distortion and equalization. Any of the above-described system characteristic changes, and other possible configuration or operating parameter changes made in system 10 that may generate artifacts, may be postponed by system control block 12 until masking window determination block 20 determines that sufficient masking is present.

Figure 2:
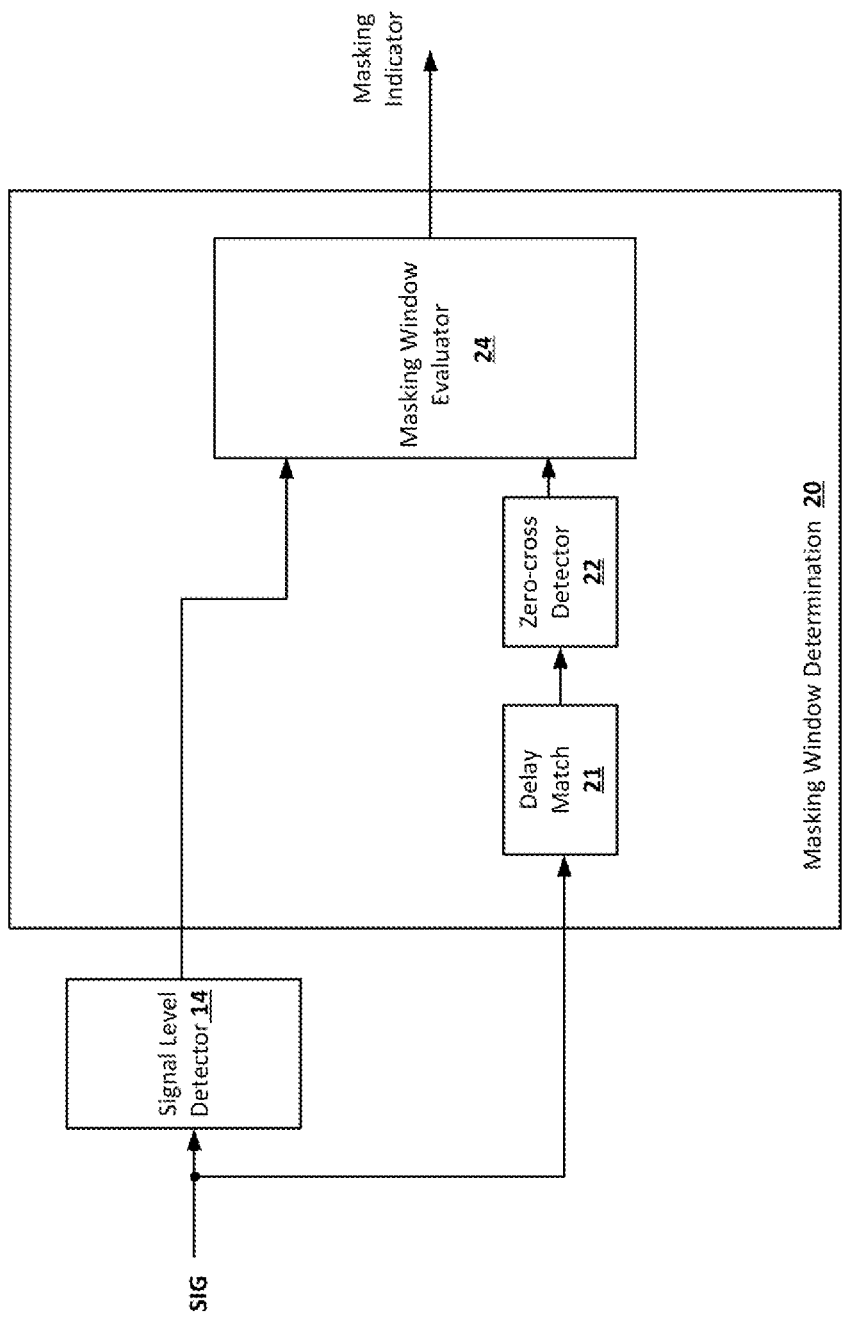
FIG. 2 is a block diagram illustrating an example implementation of masking window determination block 20 in example system 10 of FIG. 1.

Referring now to FIG. 2, a block diagram illustrating an example implementation of masking window determination block 20 in example system 10 of FIG. 1, is shown. A masking window evaluator 24 compares historic and/or present values of the output of signal level detector 14 to determine whether or not sufficient direct or temporal masking is available to make a system configuration change. While the illustrated masking window evaluator 24 provides a single masking indicator, it is understood that tables of masking signal energy values may be determined for different system configuration changes and in such embodiments, different indications may be provided to system control block 12 of FIG. 1, so that, for example, a gain change might be allowed to proceed due to sufficient available masking, while a path change might require pending with the same amount of available masking energy. A delay matching block 21 provides a delay so that determinations of zero-crossings made by a zero-cross detector 22 are time-aligned with indications from signal level detector 14, so that the masking window indication Masking Indicator provided by masking window determination block 20 may be synchronized with zero-crossings of input signal In, which may further reduce the audibility of artifacts generated by system configuration changes, allowing for qualification of masking windows at lower signal levels.

Figure 3:
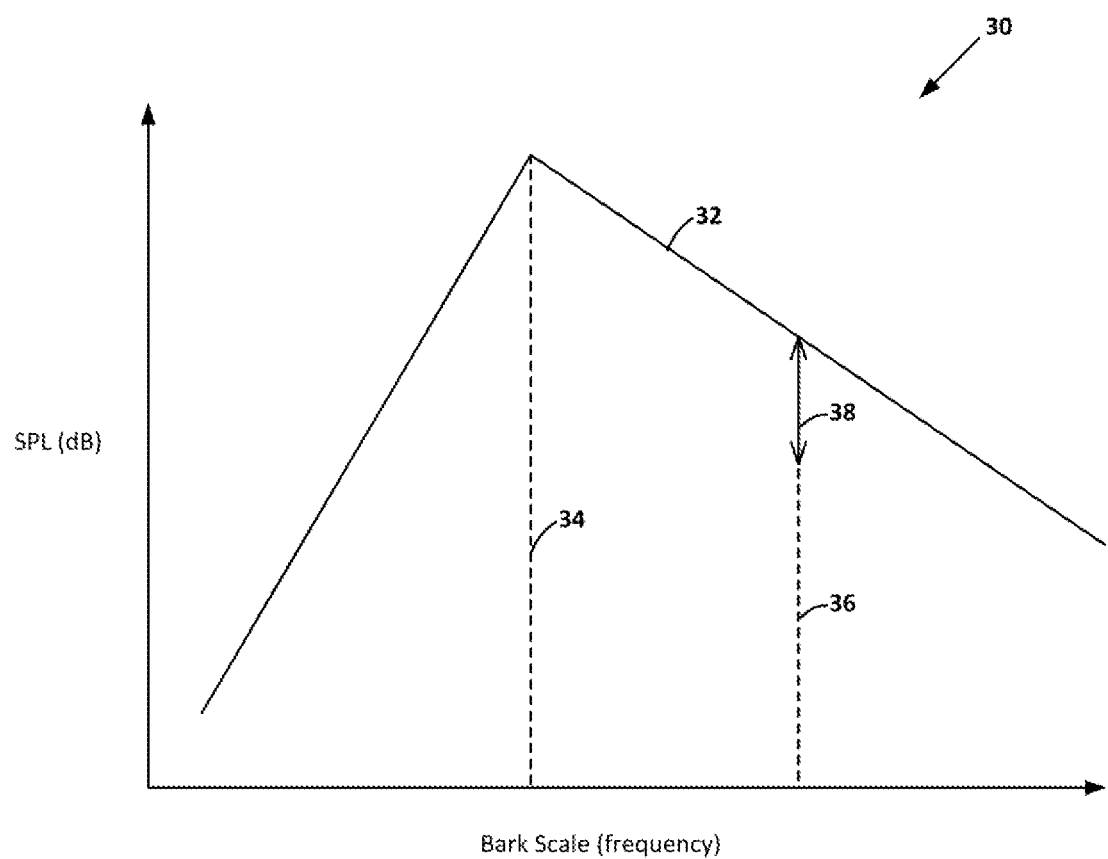
FIG. 3 is a graph 30 illustrating an example operating principle of example system 10 of FIG. 1.

Referring now to FIG. 3, a graph 30 illustrating an example operating principle of example system 10 of FIG. 1, is shown. A signal or signal component providing masking, i.e., a masking tone 34, which may be assumed to be a sine wave at a fundamental frequency $f_v$, provides a masking effect indicated by a masking threshold amplitude profile 32 across a range of adjacent frequencies, which are shown according to a linear approximate masking model based on the Bark scale. The Bark scale masking model relationship may be approximated by:

$$zv = 13.0 \tan^{-1} 0.76 f; f < 1.5 \text{ kHz and}$$

$$zv = 8.7 + 14.21 \log_{10} f; f > 1.5 \text{ kHz,}$$

where $z_v$ is the Bark equivalent of frequency $f_v$. The slope of masking threshold amplitude profile 32 on the low frequency side of $z_v$ is 27 dB/Bark and the slope of masking threshold amplitude profile 32 on the high frequency side of $z_v$ is $-(24+230/f_v-0.2L_v)$ dB/Bark where $L_v$ is the amplitude (dB) of masking tone 34. A "maskee" signal 36 has an amplitude that is less than masking threshold amplitude profile 32 by an amplitude margin 38, which indicates that "maskee" will not be audible if masking tone 34 is present. As long as an artifact component within the range of masking threshold amplitude profile 32 has a lower amplitude than masking threshold amplitude profile 32, then that artifact component will be masked by masking tone 34, and any artifact components having amplitudes exceeding masking threshold amplitude profile 32 may be audible, unless the artifact occurs just before or after a high amplitude program audio event that provides temporal masking as described in further detail below. Example system 10 as described above, leverages the detection of a presence of potential masking sources, such as masking tone 34, in the program audio provided to digital input IN for simultaneous masking of frequency components of artifacts generated by system configuration changes, as described above, as well as other, temporal masking effects as described in further detail below.

Figure 4A:
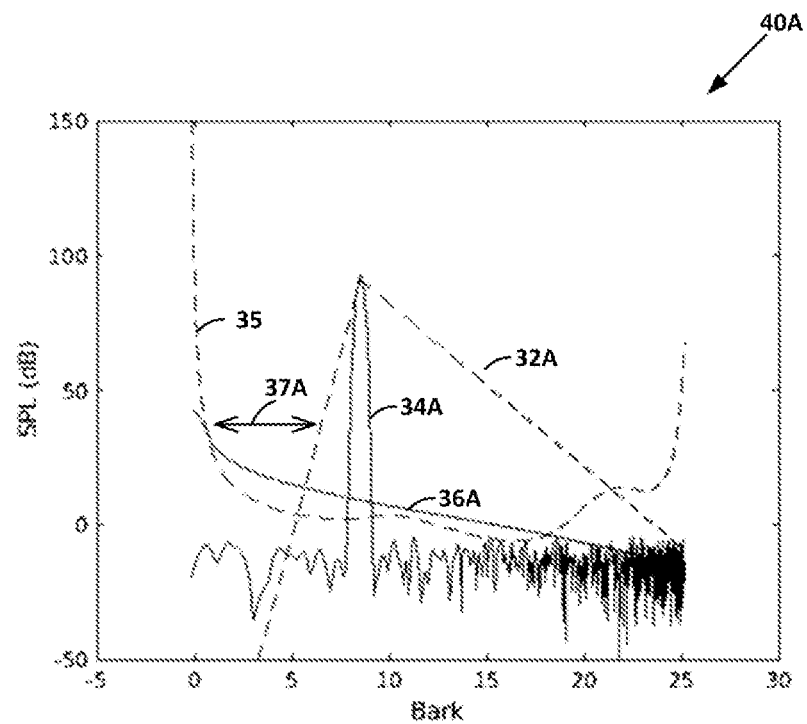
FIG. 4A and FIG. 4B are graphs 40A, 40B illustrating examples of audio masking performed in example system 10 of FIG. 1.
Figure 4B:
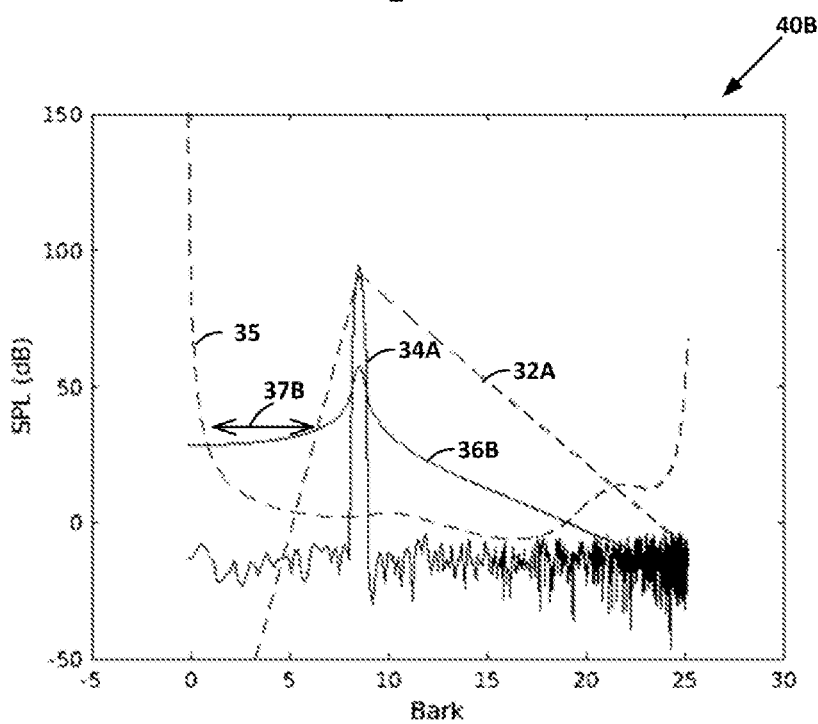

Referring now to FIG. 4A and FIG. 4B, graphs 40A, 40B illustrating examples of audio masking performed in example system 10 of FIG. 1 are shown. Similar to graph 30 of FIG. 3, graph 40A illustrates a masking threshold amplitude profile 32A provided by a masking tone 34A, compared to the audio spectrum 36A of a pop artifact occurring in an audio channel. In graph 40A, the pop is due to a shift in DC offset in the audio channel and has a broadband spectrum. Graph 40A also illustrates the masking benefit of the absolute threshold of hearing, shown by curve 35. Amplitude levels below absolute threshold of hearing curve 35 will not be heard, irrespective of the presence of masking, so that in graph 40A, any artifacts occurring outside of the frequency range between the frequencies at which curve 35 and masking threshold amplitude profile 32A cross and that have an amplitude lower than curve 35, will not be heard. While audio spectrum 36A of the pop artifact due to the DC offset shift is well-masked at the frequencies around masking tone 34A, there is a frequency region 37A in which the audio spectrum 36A of the pop artifact is not masked, and may therefore be audible. In graph 40B, the artifact is a pop is due to a change in channel gain and the change is synchronized to the zero-crossing of the program signal. The audio spectrum 36B of the pop artifact due to the gain shift is similar to that of masking tone 34A, since masking tone 34A is present in the program audio and the artifact in graph 40B is just a step change in gain applied to the program audio. While audio spectrum 36B of the gain shift pop artifact is well-masked at the frequencies around masking tone 34A, there is a frequency region 37B in which the audio spectrum 36B of the pop artifact is not masked, and may therefore be audible. Since it is the program audio spectrum that is used to provide the simultaneous masking discussed above, in order to make system configuration changes that generate artifacts which will not be contained beneath masking threshold amplitude profile 32A of the instant signal, potential temporal masking windows may be located and evaluated for the potential to make the system configuration change inaudibly.

Figure 5A:
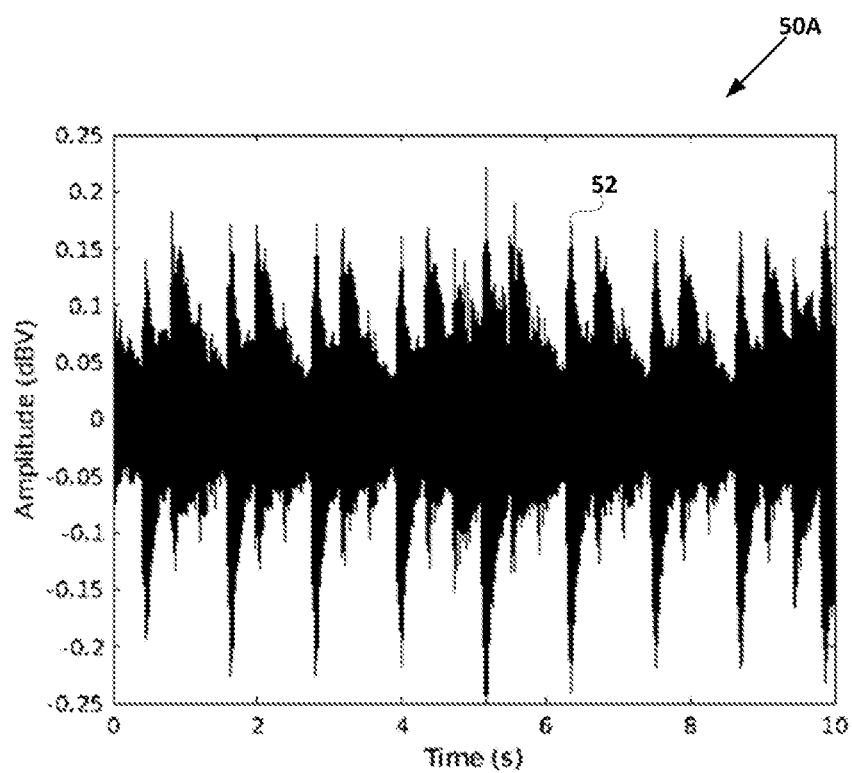
FIG. 5A and FIG. 5B are graphs 50A, 50B depicting an example audio waveform that may be processed by example system 10 of FIG. 1.
Figure 5B:
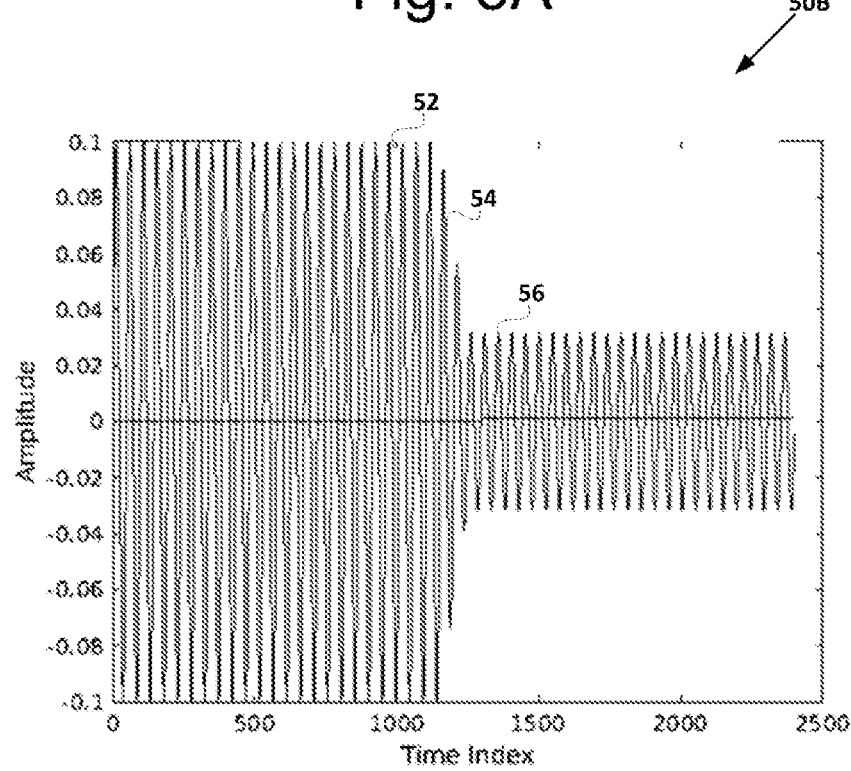

FIG. 5A and FIG. 5B are graphs 50A, 50B depicting an example audio waveform that may be processed by example system 10 of FIG. 1. As illustrated in FIG. 5A, Peaks 52 in the waveform indicate prospective locations of masking times that may be analyzed for prospective masking candidate intervals during which a system configuration change may be made inaudibly. FIG. 5B illustrates a "tail" of one of the peak intervals, which, after a ramp down 54 during which the output of signal level detector 14 of FIG. 1 and FIG. 2 will be decreasing, the signal level settles to a final amplitude 56, which in the instant example is non-zero. The illustrated example may be a candidate for temporal masking and it may be undesirable to make system configuration changes at the occurrences of peaks 52, because artifacts such as changes due to signal path changes and gain changes may have much greater energy than changes made during low-signal-amplitude intervals, especially when the changes are also synchronized with zero-crossings of the signal. Therefore, the beginning of the interval of final amplitude 56 may be highly desirable as a masking interval because temporal masking due to the previous high-amplitude peak 52 is still available for a time after peak 52. The same is true when the system has sufficient delay to identify an upcoming peak, and a temporal masking interval may be available prior to the upcoming peak.

Figure 5C:
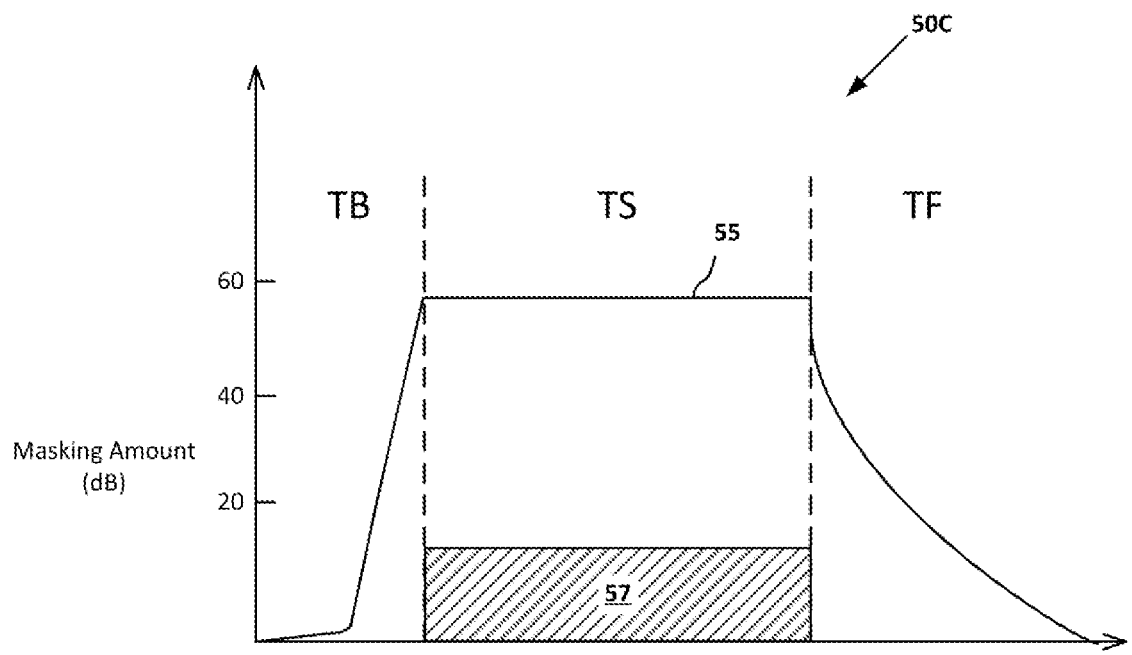
FIG. 5C is a graph 50C depicting a portion of a signal amplitude profile of the example audio waveform.
Figure 5D:
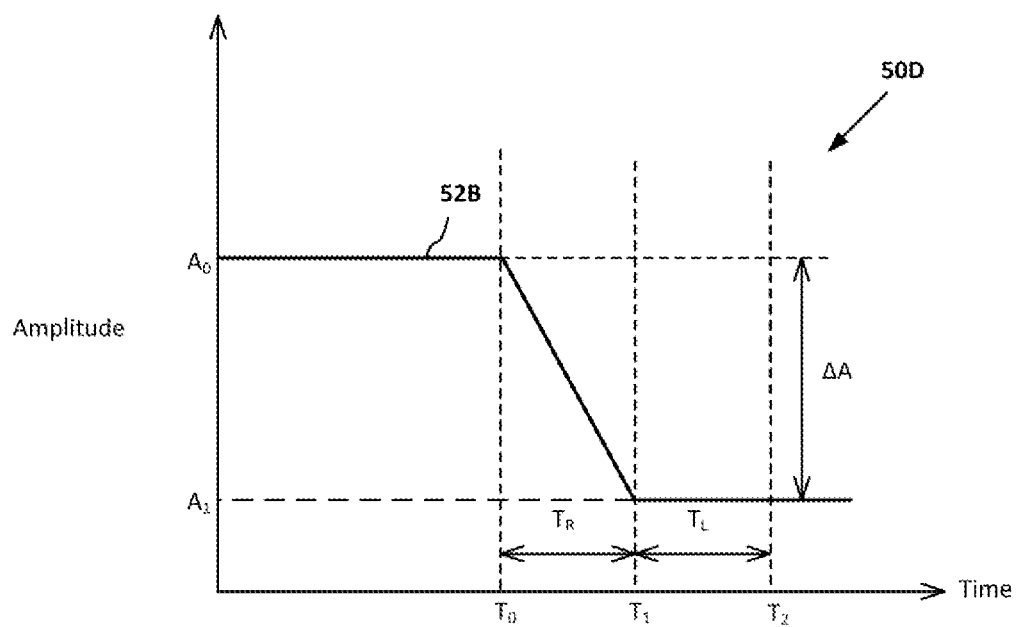
FIG. 5D is a graph 50D depicting a masking amount available before, during, and after, a peak in the example audio waveform illustrated in FIG. 5A and FIG. 5B.

FIG. 5C is a graph 50C depicting a portion of a signal amplitude profile of the example audio waveform, and FIG. 5D is a graph 50D depicting a masking amount available before, during, and after, a peak in the example audio waveform illustrated in FIG. 5A and FIG. 5B. In FIG. 5C, graph 50C shows an available masking amplitude 55 for the different masking intervals available from a program signal 57. The amplitude level of program signal 57 is not illustrated, only the duration. During a backward-masking (or pre-masking) interval TB, if an artifact occurs having an amplitude less than available masking level 55, the artifact will not be audible, as the artifact will be masked by the subsequent occurrence of program signal 57. During a simultaneous masking interval, i.e., during presence of program signal 57, an artifact having an amplitude less than the available masking level, which in the example is 60 dB, the artifact will also not be heard, however an artifact caused by a system configuration change during presence of program signal 57 may have a much higher amplitude than if the configuration change were made during pre-masking interval TB, or if the system configuration change is made during a post-masking (or forward-masking) interval TF that is available after program signal 57 has ended. Types of masking intervals may be combined to extend the potential masking, for example, an on-line calibration process of long duration may be masked by detecting a program signal having large enough peaks for simultaneous masking, while the peaks are closely spaced so that they provide temporal masking both before and after the peaks, might provide an effective masking interval of substantial duration. Combinations of either pre-masking or post-masking with simultaneous masking is also possible, in particular when detected potential pre-masking and post-masking intervals are of relatively short duration. Presence or absence of program signal 57 is indicated only for illustration, and may correspond to program signal being above a certain level, or having frequency content in an interval of interest that is above a certain amplitude. Graph 50D of FIG. 5D illustrates a shift in amplitude similar to that shown in graph 50B of FIG. 5B. e.g., a peak 52 in a program signal level 52B having an initial amplitude $A_0$ which ramps down to a lower amplitude $A_1$ at a time $T_1$. Time interval $T_R$ illustrates a ramp down time during which the output of signal level detector 14 of FIG. 1 and FIG. 2 is decreasing by an amplitude change $\Delta A$ and may be monitored by masking window evaluator 24, at time $T_1$, masking window evaluator 24 begins a timer that may start synchronization of a system configuration change with zero-crossings of the program signal and after a lag time interval $T_L$, the system configuration change is made at time $T_2$.

Figure 6A:
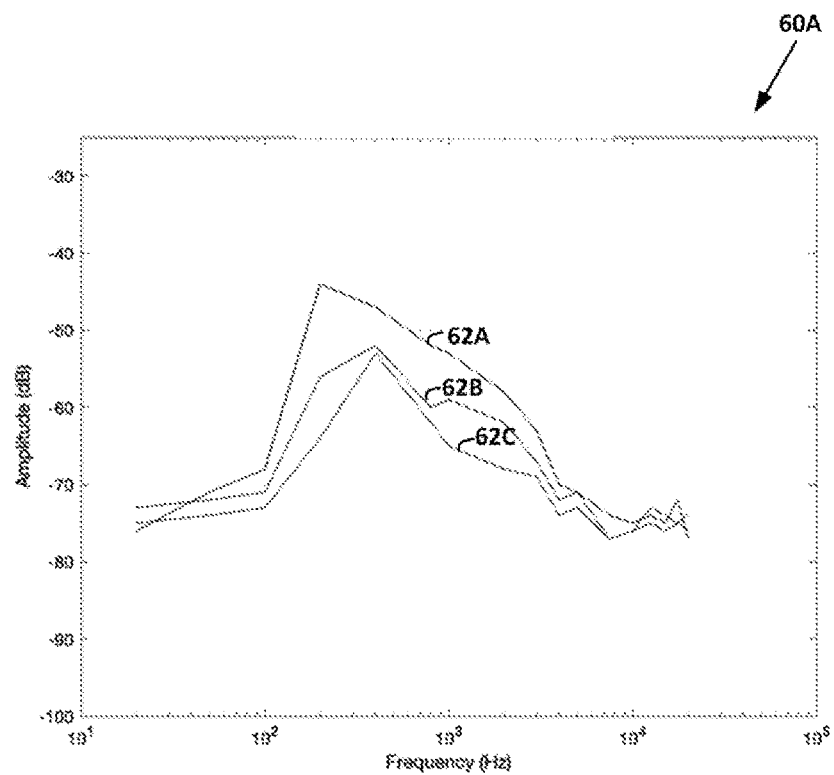
FIG. 6A and FIG. 6B are graphs 60A, 60B depicting example curves of audibility thresholds of example artifacts in system 10 of FIG. 1.
Figure 6B:
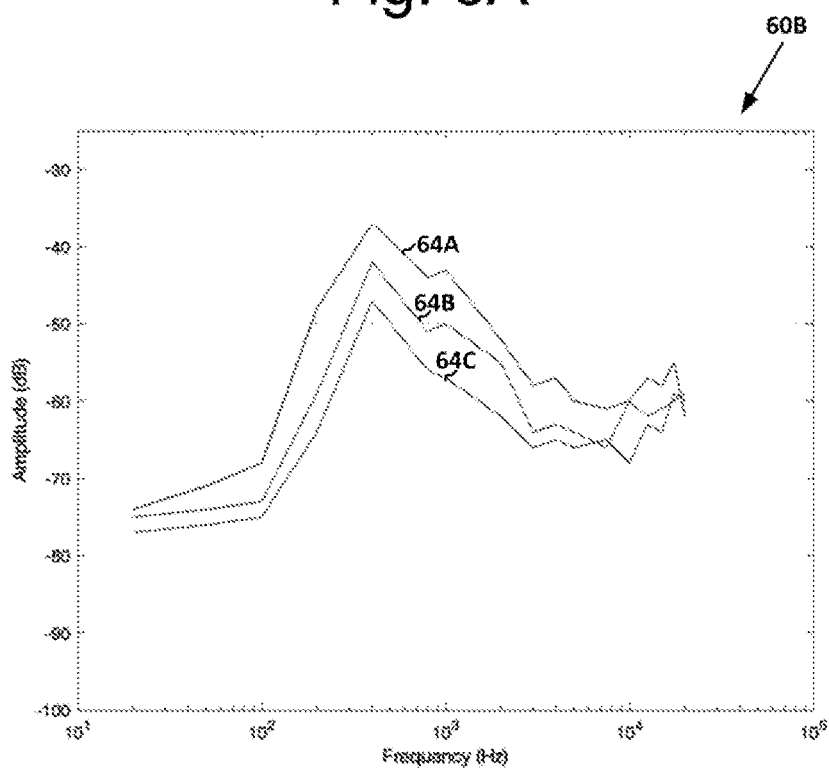

FIG. 6A and FIG. 6B are graphs 60A, 60B depicting example audibility thresholds of example artifacts in system 10 of FIG. 1 versus frequency. In FIG. 6A, graph 60A illustrates audible thresholds relative to the signal level for a DC shift as shown in the graph introduced into system 10, which may represent for example, a DC shift introduced by a path selection change. Curves 62A, 62B and 62C compare the magnitude of the DC shift at the minimum audible amplitude using sine wave signal amplitudes of 0.5V, 0.25V and 0.125V, respectively, over a range of frequencies. Graph 60A illustrates the frequency dependence of the threshold of hearing of the generated artifact over frequency and over signal amplitude variation, which shows that the ear is most sensitive to the frequency range of 100 Hz to about 4 kHz for a pop due to an offset shift, and that as signal amplitude increases, the pops are less audible. Graph 60A shows that searching for substantial audio content in the 100 Hz-4 kHz frequency range would be useful for finding masking intervals having the best masking performance for pops due to DC shifts. Similarly, in FIG. 6B, graph 60B illustrates audible thresholds relative to the signal level for a gain shift introduced into system 10, for example, by a change in a gain control value. Curves 62A, 62B and 62C show the audibility, and thus masking thresholds, for minimum audible gain shifts using sine wave test signal levels of 0.5V, 0.25V and 0.125V, respectively, over a range of frequencies. Graphs 60A and 60B may be used to determine whether suitable masking is available for the particular artifacts given a certain signal level, where the frequency content of the signal is scaled by the audibility threshold curves of graphs 60A and 60B, to determine whether sufficient masking is available across the range of frequencies.

Figure 7:
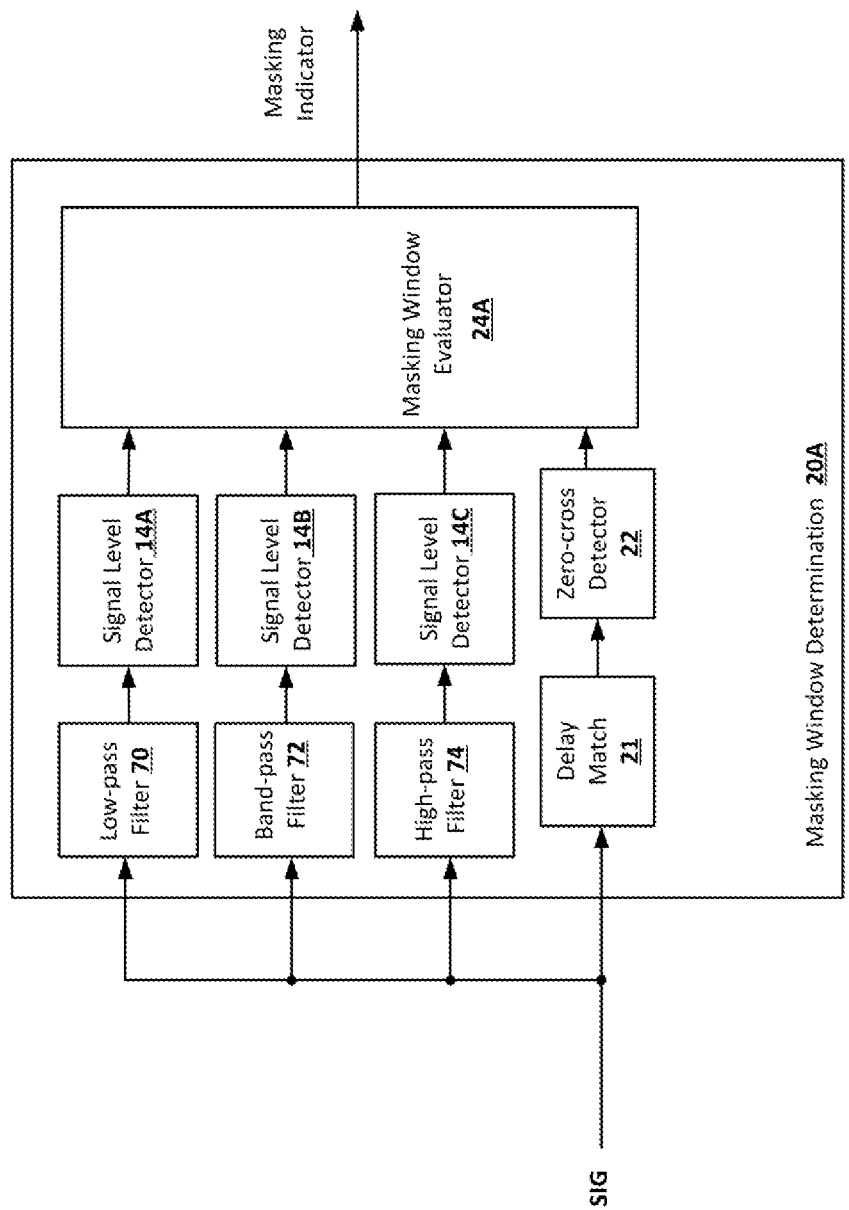
FIG. 7 is a block diagram illustrating another example implementation of a masking window determination block 20A that may be used to implement masking window determination block 20 in example system 10 of FIG. 1.

FIG. 7 is a block diagram illustrating another example implementation of a masking window determination block 20A that may be used to implement masking window determination block 20 in example system 10 of FIG. 1. Example masking window determination block 20A includes multiple filters, including a low-pass filter 70, a band-pass filter 72 and a high-pass filter 74 that, in the example, separate the program audio signal SIG into three separate bands, although in other embodiments, the frequency ranges of any number of filters could overlap, and even include the passband of other filters. A corresponding set of signal level detectors 14A-14C detect the signal levels of the outputs of low-pass filter 70, band-pass filter 72 and high-pass filter 74. A masking window evaluator 24A receives the outputs of signal level detectors 14A-14C and may make determinations based on a priori information about the spectra of system configuration changes in general, or specific information about a requested type of system configuration change, in order to identify available pre-masking, post-masking and/or simultaneous masking intervals that are available for masking the requested configuration change, and provide a control signal Masking Indicator when the masking interval is present.

Figure 8:
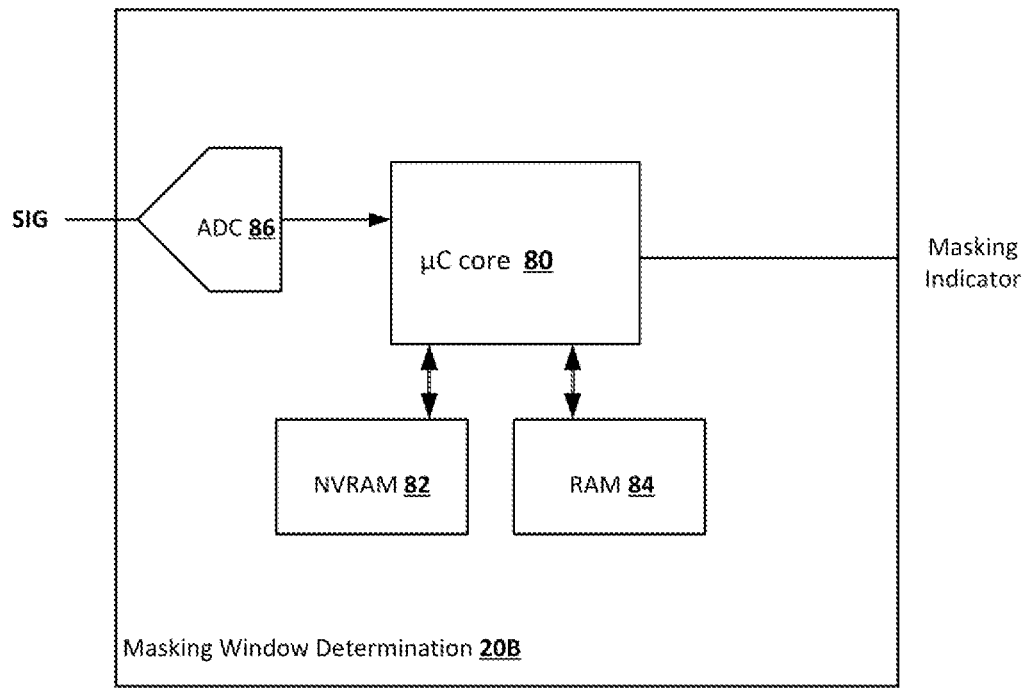
FIG. 8 is a block diagram illustrating another example implementation of a masking window determination block 20B that may be used to implement masking window determination block 20 in example system 10 of FIG. 1.

FIG. 8 is a block diagram illustrating another example implementation of a masking window determination block 20B that may be used to implement masking window determination block 20 in example system 10 of FIG. 1. Masking window determination block includes a microcontroller (µC) core 80 that executes program instructions comprising a computer program product stored in a non-volatile memory (NVRAM) 82 that carries out methods as described herein to perform the evaluation and signaling of availability of masking windows via signal Masking Indicator. Storage for program data such as audio samples is also provided by a random-access memory (RAM) 84. An analog-to-digital converter (ADC) 86 receives program signal SIG to provide samples of the program audio for evaluation. The program instructions may perform filtering as illustrated by low-pass filter 70, band-pass filter 72 and high-pass filter 74 of masking window determination block 20A of FIG. 7, or discrete filters may be provided by a signal level detector with outputs measured by a multiplexed ADC 86 instead of receiving program audio signal SIG directly. Alternatively, a single-band system such as masking window determination block 20 of FIG. 2 may be implemented by the program instructions.

FIG. 9 is a flowchart illustrating an example masking window evaluation process that may be implemented by masking window determination block 20B of FIG. 8. Until a system configuration control change is requested (decision 90), the masking window evaluation process is idle, but may be collecting prospective masking interval information. When the configuration control change is requested (decision 90), a signal amplitude buffer is scanned (step 92) and the control change is pended (step 94). If a masking window of sufficient amplitude is available to mask the requested control change (decision 96), and if the masking window is of sufficient duration (decision 98), then the control change is released (step 102). Otherwise, if a timeout is reached that will allow the control change to proceed without masking (decision 100), the control change is released (step 102). Until the timeout is complete (step 100) or a masking window of sufficient amplitude (decision 96) and duration (decision 98) is found, the control change remains pending (step 94). The above process from steps 90-102 is repeated for subsequent control change requests. The tests for a masking of sufficient duration amplitude (decision 96) and duration (decision 98) may be based on predictions/estimation and the duration may be qualified as a threshold duration corresponding to a minimum masking interval for at least a portion of the transient. A predicted masking interval may be based on a rate of change of the signal level and the signal level itself, and may be based on observing previous signal level peaks to predict the timing of a next peak, effectively synchronizing masking intervals to observed signal level peaks.

As mentioned above, portions of the disclosed processes may be carried out by the execution of a collection of program instructions forming a computer program product stored on a non-volatile memory, but that also exist outside of the non-volatile memory in tangible forms of storage forming a computer-readable storage medium. The computer-readable storage medium may be, for example, but is not limited to, an electronic storage device, a magnetic storage device, an optical storage device, an electromagnetic storage device, a semiconductor storage device, or any suitable combination of the foregoing. Specific examples of the computer-readable storage medium include the following: a hard disk, semiconductor volatile and non-volatile memory devices, a portable compact disc read-only memory (CD-ROM) or a digital versatile disk (DVD), a memory stick, a floppy disk or other suitable storage device not specifically enumerated. A computer-readable storage medium, as used herein, is not to be construed as being transitory signals, such as transmission line or radio waves or electrical signals transmitted through a wire. It is understood that blocks of the block diagrams described above may be implemented by computer-readable program instructions. These computer readable program instructions may also be stored in other storage forms as mentioned above and may be downloaded into a non-volatile memory for execution therefrom. However, the collection of instructions stored on media other than system non-volatile memory described above also form a computer program product that is an article of manufacture including instructions which implement aspects of the functions/actions specified in the block diagram block or blocks.

In summary, this disclosure shows and describes audio processing circuits, systems and methods of operation of the systems and circuits that reproduce an audio input signal. The audio processing system may include an audio processing channel having an input for receiving an audio input signal and producing an audio output signal. The audio processing channel may have an adjustable or selectable element that changes a characteristic of the audio processing channel that generates a transient in the audio output signal. The adjustable or selectable element may be responsive to a control signal to change the characteristic. The audio processing system may include a signal level detector for measuring a signal level of the audio input signal and a controller responsive to an output of the signal level detector to determine a masking time interval available from the audio output signal due to signal content in the audio input signal and that generates the control signal to change the characteristic of the audio processing channel so that at least a portion of the transient occurs in the masking time interval.

In some example embodiments, the masking time interval may be a time interval commenced in response to a drop in the signal level measured by the signal level detector from a prior greater signal level interval to a present lesser signal level interval, so that an amplitude of the transient due to the change in the characteristic of the audio processing channel may be reduced due to the change in the characteristic of the audio processing channel being applied within the present lesser signal level interval, while temporal masking due to the prior greater signal level interval may provide increased masking capability. In some example embodiments, a delay of a delay path through the audio processing channel may be greater than a response delay of the signal level detector so that a subsequent signal level may be measured by the signal level detector. The masking time interval may be a time interval commenced in response to an increase in the signal level measured by the signal level detector from a present lesser signal level interval to a subsequent greater signal level interval, so that an amplitude of the transient due to the change in the characteristic of the audio processing channel may be reduced due to the change in the characteristic of the audio processing channel being applied within the present lesser signal level interval, while temporal masking due to the subsequent greater signal level interval may provide increased masking capability. In some example embodiments, the audio processing system includes a zero-cross detector for detecting zero-crossings of the audio input signal, and the controller may further synchronize the control signal with the zero-crossings of the audio input signal to minimize the magnitude of the transient.

In some example embodiments, the audio processing channel includes a plurality of audio signal amplification paths, and the adjustable or selectable element may be a selector that selects from among the plurality of audio signal amplification paths. The transient may be due to selection between differing ones of the audio signal amplification paths. In some example embodiments, the controller may receive a mode switch command indicating a change in operating mode of the audio processing system, so that a present operating mode corresponds to selection of a first one of the plurality of audio signal amplification paths, and so that a commanded operating mode corresponds to a second one of the plurality of audio signal amplification paths. The controller may postpone selecting the commanded operating mode until the masking interval is available.

In some example embodiments, the signal level detector may include multiple filters having corresponding differing audio passbands and corresponding envelope detectors for detecting levels of the audio input signal in the differing audio passbands. The controller may determine the temporal masking interval from outputs of the envelope detectors indicating that sufficient masking will be available in the audio output signal in the differing audio passbands to mask the transient. In some example embodiments, the controller may determine a rate of change of the output of the signal level detector and may determine a duration of a prospective masking interval from the rate of change of the output of the signal level detector and the output of the signal level detector directly, so that the prospective masking interval may be determined to be an available masking interval when the duration exceeds a threshold duration corresponding to a minimum masking interval for the at least a portion of the transient to be masked. In some example embodiments, the controller may determine that the prospective masking interval is an available masking interval when a predicted signal level of the audio output signal exceeds a threshold level at an end of the prospective masking interval. In some example embodiments, the controller may detect peaks in the output of the signal level detector and predict one or more subsequent peaks based on timing of the detected peaks. The controller may synchronize initiation of one or more masking time intervals at one or more predetermined times after the one or more subsequent peaks.

It should be understood, especially by those having ordinary skill in the art with the benefit of this disclosure, that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense. Similarly, although this disclosure makes reference to specific embodiments, certain modifications and changes may be made to those embodiments without departing from the scope and coverage of this disclosure. Moreover, any benefits, advantages, or solutions to problems that are described herein with regard to specific embodiments are not intended to be construed as a critical, required, or essential feature or element.

While the disclosure has shown and described particular embodiments of the techniques disclosed herein, it will be understood by those skilled in the art that the foregoing and other changes in form, and details may be made therein without departing from the spirit and scope of the disclosure. For example, the disclosed system may be used to mask other artifacts in an audio system, such as an audio microphone signal preamplifier.

What is claimed is:

1. An audio processing system, comprising:
an audio processing channel having an input for receiving an audio input signal and producing an audio output signal, wherein the audio processing channel has an adjustable or selectable element that changes a characteristic of the audio processing channel that generates a transient in the audio output signal, wherein the adjustable or selectable element is responsive to a control signal to change the characteristic;

a signal level detector for measuring a signal level of the audio input signal; and a controller responsive to an output of the signal level detector to determine a masking time interval available from the audio output signal, wherein the masking time interval is an interval of time during which masking of the generated transient by the audio output signal is available due to signal content in the audio input signal reproduced in the audio output signal, and wherein the controller generates the control signal to cause the change in the characteristic of the audio processing channel to occur in a timed relationship with the masking time interval so that at least a portion of the transient occurs within the masking time interval.

2. The audio processing system of claim 1, wherein the masking time interval is a time interval commenced in response to a drop in the signal level measured by the signal level detector from a prior greater signal level interval to a present lesser signal level interval, so that an amplitude of the transient due to the change in the characteristic of the audio processing channel is reduced due to the change in the characteristic of the audio processing channel being applied within the present lesser signal level interval.

3. The audio processing system of claim 1, wherein a delay of a delay path through the audio processing channel is greater than a response delay of the signal level detector so that a subsequent signal level is measured by the signal level detector, wherein the masking time interval is a time interval commenced in response to an increase in the signal level measured by the signal level detector from a present lesser signal level interval to a subsequent greater signal level interval, so that an amplitude of the transient due to the change in the characteristic of the audio processing channel is reduced due to the change in the characteristic of the audio processing channel being applied within the present lesser signal level interval.

4. The audio processing system of claim 1, further comprising a zero-cross detector for detecting zero-crossings of the audio input signal, and wherein the controller further synchronizes the control signal with the zero-crossings of the audio input signal to minimize the magnitude of the transient.

5. The audio processing system of claim 1, wherein the audio processing channel comprises a plurality of audio signal amplification paths, wherein the adjustable or selectable element is a selector that selects from among the plurality of audio signal amplification paths, and wherein the transient is due to selection between differing ones of the audio signal amplification paths.

6. The audio processing system of claim 5, wherein the controller receives a mode switch command indicating a change in operating mode of the audio processing system, wherein a present operating mode corresponds to selection of a first one of the plurality of audio signal amplification paths, and wherein a commanded operating mode corresponds to a second one of the plurality of audio signal amplification paths, and wherein the controller postpones selecting the commanded operating mode until the masking interval is available.

7. The audio processing system of claim 1, wherein the signal level detector comprises:

a plurality of filters having corresponding differing audio passbands; and a plurality of envelope detectors corresponding to the plurality of filters for detecting levels of the audio input signal in the differing audio passbands, and wherein the controller determines the temporal masking interval from outputs of the plurality of envelope detectors indicating that sufficient masking will be available in the audio output signal in the differing audio passbands to mask the transient.

8. The audio processing system of claim 1, wherein the controller further determines a rate of change of the output of the signal level detector and determines duration of a prospective masking interval from the rate of change of the output of the signal level detector and the output of the signal level detector, so that the prospective masking interval is determined to be an available masking interval when the duration exceeds a threshold duration corresponding to a minimum masking interval for the at least a portion of the transient to be masked.

9. The audio processing system of claim 1, wherein the controller further determines a rate of change of the output of the signal level detector and determines a prospective masking interval from the rate of change of the output of the signal level detector and the output of the signal level detector, so that the prospective masking interval is determined to be an available masking interval when a predicted signal level of the audio output signal exceeds a threshold level at an end of the prospective masking interval.

10. The audio processing system of claim 1, wherein the controller detects peaks in the output of the signal level detector and predicts one or more subsequent peaks based on timing of the detected peaks, and wherein the controller synchronizes initiation of one or more masking time intervals at one or more predetermined times after the one or more subsequent peaks.

11. A method of processing audio, comprising:

receiving an audio input signal;

generating an audio output signal from the audio input signal with an audio processing channel, wherein the audio processing channel has an adjustable or selectable element that changes a characteristic of the audio processing channel that generates a transient in the audio output signal, wherein the adjustable or selectable element is responsive to a control signal to change the characteristic;

measuring a signal level of the audio input signal with a signal level detector;

determining a masking time interval available from the audio output signal, wherein the masking time interval is an interval of time during which masking of the generated transient by the audio output signal is available due to signal content in the audio input signal reproduced in the audio output signal; and generating the control signal to cause the change in the characteristic of the audio processing channel to occur in a timed relationship with the masking time interval so that at least a portion of the transient occurs within the masking time interval.

12. The method of claim 11, wherein the masking time interval is a time interval commenced in response to a drop in the signal level measured by the signal level detector from a prior greater signal level interval to a present lesser signal level interval, so that an amplitude of the transient due to the change in the characteristic of the audio processing channel is reduced due to the change in the characteristic of the audio processing channel being applied within the present lesser signal level interval.

13. The method of claim 11, wherein a delay of a delay path through the audio processing channel is greater than a response delay of the signal level detector so that a subsequent signal level is measured by the signal level detector, wherein the masking time interval is a time interval commenced in response to an increase in the signal level measured by the signal level detector from a present lesser signal level interval to a subsequent greater signal level interval, so that an amplitude of the transient due to the change in the characteristic of the audio processing channel is reduced due to the change in the characteristic of the audio processing channel being applied within the present lesser signal level interval.

14. The method of claim 11, further comprising:
detecting zero-crossings of the audio input signal; and
synchronizing the control signal with the zero-crossings of the audio input signal to minimize the magnitude of the transient.

15. The method of claim 11, wherein the audio processing channel comprises a plurality of audio signal amplification paths, wherein the adjustable or selectable element is a selector that selects from among the plurality of audio signal amplification paths, and wherein the transient is due to selection between differing ones of the audio signal amplification paths.

16. The method of claim 15, further comprising
receiving a mode switch command indicating a change in operating mode, wherein a present operating mode corresponds to selection of a first one of the plurality of audio signal amplification paths; and
responsive to receiving the mode switch command, selecting a second one of the plurality of audio signal amplification paths, wherein the selecting is postponed from receipt of the mode switch command until the masking interval is available.

17. The method of claim 11, further comprising:
filtering the audio input signal with a plurality of filters having corresponding differing audio passbands; and
detecting levels of the audio input signal in the differing audio passbands, and wherein the determining the temporal masking interval determines the temporal masking interval by the levels of the audio input signal indicating that sufficient masking will be available in the audio output signal in the differing audio passbands to mask the transient.

18. The method of claim 11, further comprising:
determining a rate of change of the signal level; and
determining a duration of a prospective masking interval from the rate of change of the signal level and the signal level, so that the prospective masking interval is determined to be an available masking interval when the duration exceeds a threshold duration corresponding to a minimum masking interval for the at least a portion of the transient to be masked.

19. The method of claim 11, further comprising:
determining a rate of change of the signal level; and
determining a prospective masking interval from the rate of change of the signal level and the signal level, so that the prospective masking interval is determined to be an available masking interval when a predicted signal level of the audio output signal exceeds a threshold level at an end of the prospective masking interval.

20. The audio processing system of claim 11, further comprising:
detecting peaks in the signal level;
predicting one or more subsequent peaks based on timing of the detected peaks; and
synchronizing initiation of one or more masking time intervals at one or more predetermined times after the one or more subsequent peaks.

* * * * *